United States Patent [19]

Groves et al.

[11] Patent Number: 4,652,814

[45] Date of Patent: Mar. 24, 1987

[54] CIRCUIT TESTING UTILIZING DATA COMPRESSION AND DERIVATIVE MODE VECTORS

[75] Inventors: William A. Groves; Matthew L. Snook; Rodney Browen, all of Loveland, Colo.

[73] Assignee: Hewlett-Packard Company, Palo Alto, Calif.

[21] Appl. No.: 503,464

[22] Filed: Jun. 13, 1983

[51] Int. Cl.[4] .......................................... G01R 31/28
[52] U.S. Cl. ................................... 324/73 R; 371/27
[58] Field of Search ........... 324/73 AT, 73 R, 73 PC; 371/27

[56] References Cited

U.S. PATENT DOCUMENTS 4,433,414 2/1984 Carey .................................... 371/27

OTHER PUBLICATIONS

Cave, T., "Compressing Test Patterns to Fit into LSI Testers", Electronics, Oct. 12, 1978, pp. 136–140.
Electronics International, vol. 54, No. 22, Nov. 1981, New York, USA; G. C. Gillette, "Tester Takes on VLSI with 264-K Vectors Behind Its Pins", pp. 122–127, * pp. 124, 123–127 *.
Tom E. Finnell, "In-Circuit Testing of LSI-Based PCBs", Electronic Production, Sep. 1982, p. 47.

Primary Examiner—Reinhard J. Eisenzopf
Assistant Examiner—Stephen M. Baker
Attorney, Agent, or Firm—John A. Frazzini

[57] ABSTRACT

A circuit tester and test technique are presented that compresses the amount of data stored in local test data RAMs for the implementation of a circuit test, thereby reducing the amount of data that must be downloaded to the local test data RAMs, thereby improving test throughput. Derivative data vectors are utilized in addition to raw data vectors as part of the data compression technique. Further compression results from storing only unique data vectors in the local test data RAMs and utilizing a sequencer to control the order in which the unique data vectors are utilized. The sequencer includes test program logic and logic capable of implementing on test pins indirect counters.

13 Claims, 7 Drawing Figures

|  | | PIN | | | |
|---|---|---|---|---|---|
| | LOCAL TEST DATA | THIRD STATE RAM | DATA RAMS | | MASK RAM |
| | | | J | K | |
| STIMULUS STATES | S0 | 1 | 0 | 1 | 1 |
| | S1 | 1 | 1 | 0 | 1 |
| | SK | 1 | 0 | 0 | 1 |
| | ST | 1 | 1 | 1 | 1 |
| RESPONSE STATES | R0 | 0 | 0 | 1 | 1 |
| | R1 | 0 | 1 | 0 | 1 |
| | RK | 0 | 0 | 0 | 1 |
| | RT | 0 | 1 | 1 | 1 |
| DON'T CARE | X | 0 | 0 | 0 | 0 |

FIG. 3

| COUNTER STATES | DERIVATIVE MODE DATA |
|---|---|
| 0000 | KKKT |
| 0001 | KKTT |
| 0010 | KKKT |
| 0011 | KTTT |
| 0100 | KKKT |
| 0101 | KKTT |
| 0110 | KKKT |
| 0111 | TTTT |
| 1000 | KKKT |
| 1001 | KKTT |
| 1010 | KKKT |
| 1011 | KTTT |
| 1100 | KKKT |
| 1101 | KKTT |
| 1110 | KKKT |
| 1111 | KKKT |

FIG. 4A

| BIT 3 | BIT 2 | BIT 1 | BIT 0 |
|---|---|---|---|
| K | K | K | T |
| K | K | T | T |
| K | T | T | T |
| T | T | T | T |

FIG. 4B

LOCAL TEST RAM CONTENTS

| LOCAL TEST RAM: | 0 | 1 | 2 | 3 | 4 | 5 |
|---|---|---|---|---|---|---|
| ADDRESS | | | | | | |
| 100 | 0 | 0 | 0 | 0 | 0 | 0 |
| 101 | DK | DK | DK | DT | - | - |
| 102 | DK | DK | DT | DT | - | - |
| 103 | DK | DT | DT | DT | - | - |
| 104 | DT | - | - | - | - | - |
| ... | | | | | | |
| 200 | - | DK | - | DK | DK | DT |
| 209 | - | DK | - | DT | DK | DT |
| 118 | - | DT | - | DT | DK | DT |
| 6 | - | DT | - | DT | DT | DT |

FIG. 4C

CIRCUIT TESTING UTILIZING DATA COMPRESSION AND DERIVATIVE MODE VECTORS

BACKGROUND OF THE INVENTION

The disclosed invention relates in general to circuit testing and more particularly to in-circuit testing utilizing data compression techniques to reduce equipment costs, speed-up test rates and reduce problems due to overheating of elements in the circuits under test. In early generations of circuit testers, circuits were tested by a method, known as functional testing, in which test signals are applied only at circuit inputs and output signals are monitored only at circuit outputs. Such functional testing suffers from at least two serious limitations. First, it is difficult to determine test patterns suitable for testing the circuit under test since each circuit is unique. Second, isolation of a fault requires backtracing of the circuit and does not lend itself to automatic diagnosis.

These limitations are particularly severe in circuits containing some sort of sequential circuits (e.g. RAM, flip-flops, etc.) because the output of the circuit is a function of the state of the circuit as well as of the applied test signals. In order to know the state of a circuit with sequential elements, it is generally necessary to apply to the inputs of its sequential elements a set of signals which alter that element's state until it enters a desired state known as its home state. The application of these signals is known as homing. Because of the complicated relation in functional testing between the signals applied at the circuit inputs and the resulting signals produced at the inputs of the individual circuit components, it is extremely difficult to determine the signals which must be applied at the circuit inputs to home the circuit. As a result of the limitations of functional testing, many circuit testers utilize a technique known as in-circuit testing in which individual components are tested directly by in-circuit application of test signals directly to the inputs of each component and observing at the outputs of each component the resulting output signals.

The use of in-circuit testing has greatly increased the thoroughness with which a circuit can be tested, but unfortunately has also introduced some problems. The backdriving of circuit nodes (i.e. the imposition of a test signal which overrides the voltage applied to that node by circuit components connected to that node) results in the heating of circuit components which can be damaged if the duration of the test is too long (on the order of hundreds of milliseconds). The number of test signals required for a complete incircuit test is much greater than that required in functional testing. This number is also increasing dramatically as circuit complexity and speed increases. The amount of test information that must be stored in the tester to test many types of circuits has become great enough that there is a real need to compress the amount of test information that needs to be stored to minimize possible damage from overheating, to reduce tester memory requirements and to increase tester throughput.

In the Zehntel Troubleshooter 800 circuit tester, a Gray code counter is used to apply test signals to input test pins. Each of the input test pins is connected to one of the bits of this counter. The counter is the major source of stimulus to a circuit under test. The output from each of the output pins is compressed by a serial cyclic redundancy check (CRC) compression technique to produce for each pin a compressed piece of output data known as a signature. In a test system having a single serial CRC compressor, a device with N outputs requires N repetitions of stimulus and response detection. These signatures are compared with the signatures produced by a known good circuit to check for circuit malfunctions. Such a system is much less suitable for generating the predetermined random set of signals needed to test circuits at least as complex as typical medium scale integration circuits than it is for generating the set of signals to test circuits that can be tested algorithmically, such as ROMs and RAMs. Because of the random nature of the input test signals, this system is not well adapted to homing circuit components.

In another class of circuit testers such as the model 2270 circuit tester manufactured by GenRad, Inc., each node in the circuit under test is connected to a pin on which test signals are applied or output signals are monitored. Each pin can be used in different test cycles to apply test signals or supply an expected response signal to be compared with an output signal monitored at that pin. In order to test circuits at high speed, each pin is connected to an associated RAM in which is stored the stimulus and response (S/R) data for that pin. This enables the S/R data to be applied in short bursts. Unfortunately, a typical RAM associated with a pin has only on the order of 1K bits so that many circuits require a large amount of data to be downloaded to these S/R data RAMs from a larger memory such as disc memory. This large amount of downloaded data requires many reloads of each of these RAMs to execute a complete test of the circuit. For example, a 64K RAM requires on the order of 250 reloads for a complete test. The time required for such reloads significantly increases the duration of many tests, thereby reducing tester throughput and increasing the risk of damage to the circuit under test.

SUMMARY OF THE INVENTION

To increase tester throughput and reduce the risk of damage to circuits under test, it is advantageous to reduce the time required for each circuit test. In accordance with the disclosed preferred embodiment, a technique and apparatus are presented which reduce the time required per test while concurrently providing sufficient flexibility of test signal generation that both algorithmic and random generation tests can be efficiently performed. The test system contains a set of bidirectional test pins—i.e., test pins which can each be individually utilized to supply test signals to the circuit under test or to monitor output data from the circuit under test. With each test pin is uniquely associated a local test data RAM which contains stimulus and response (S/R) data for use at that pin. The stimulus and response (S/R) data stored in each RAM is compressed to reduce the amount of downloaded data required for the performance of a given test. This reduction of the amount of downloaded data reduces test duration and thereby reduces the amount of heating of the circuit under test. Typically, the amount of data compression achievable by this invention avoids the need to reload S/R data during a test, but the invention is also applicable when such reload requirements remain after data compression is utilized.

The test signals produced at each pin are varied in either of two modes: the raw data mode or the derivative data mode. In the raw data mode, the S/R data indicates whether the signal on the pin is to be driven high (denoted herein as the state "1") or low (denoted herein as the state "0"). Clearly, the invention will also work for the opposite association of the 0 state with a high signal value and the 1 state with a low signal value. In the derivative mode, the S/R data indicates whether the signal on the pin is to be kept in its present state (i.e. a "keep" data denoted herein by a "K") or toggled to its complementary state (i.e. a "toggle" data denoted herein by a "T"). For example, if the state is in its low state, then a keep data preserves the low state and a toggle data drives the state high. Each of the pins is connected to a pin driver circuit capable of effecting both raw and derivative data modes. This pin driver circuit also monitors the signal on the pin and compares it on-the-fly (i.e. as each piece of data is monitored) with the signal expected on that pin. A pin pass/fail signal is generated in response to this comparison and this pin pass/fail signal can be enabled or disabled depending on whether the test procedure cares about that information. The on-the-fly production of the fail signals simplifies homing of a circuit component by utilizing the home state signal as the response data with which the output data from component is compared. These pin pass/fail signals are also sent in groups of 12 to a set of parallel CRC compressors to produce a set of compressed pieces of data known as signatures.

Each pin driver circuit is connected to the local test data RAM associated with that driver's associated pin. Each local test data RAM is four bits wide to contain the S/R data for its associated pin driver circuit. These four bits are read in parallel by its associated pin driver circuit. Each of the local test data RAMs has the same range of addresses. The set of bits in all of these RAMs having the same address is referred to as a "data vector". The test data RAMs are all accessed concurrently by a single data vector address and the pin driver circuits are responsive to the data vector resulting from such an access to produce on the pins a pattern of signals called a "vector". In this particular embodiment, there are 264 test pins so that each data vector is 1056 bits wide.

The local test RAMs contains only the unique data vectors utilized durig a given circuit test—i.e., these RAMs contain only a single copy of each data vector utilized during a test. The elimination of redundant data vectors compresses the amount of data stored in these RAMs thereby reducing the amount of downloaded data required to implement a given test. Because only the unique data vectors are stored in these RAMs, unlike prior devices in which the data in each local test RAM is accessed sequentially, the sequencing of this data is controlled by a sequencer which provides to these RAMs the address of the data vector to be utilized at any given time. For the 2K RAMs utilized in this embodiment to hold the S/R data, this requires addresses only 11 bits wide so that these addresses are much shorter than the data vectors stored in the local test data RAMs. As a result of this, much less memory is required to store the set of addresses representing the sequencing information than if the data vectors were stored redundantly in the local test data RAMs in the order in which they are utilized in a circuit test and then accessed sequentially to implement the test.

The sequencing information can be stored in the sequencer by storing data vector addresses in the sequencer in the order in which the data vectors at those addresses are to be accessed from the local test data RAMs. However, the sequencer also contains logic that enables the sequencer data to be compressed. The sequencer contains the capability of implementing nested loops, subroutines utilizing vector parameters, and other programming techniques which enable the sequence information to be stored as a program instead of just an ordered list of data vector addresses. The sequencer also contains a set of counter/registers and associated logic that enable the counters to be utilized in keeping track of program loops and subroutines. In addition, these counters are connected to a priority encoder which is utilized to produce a sequence of addresses which are supplied in derivative mode to the local test data RAMs to produce test signals equivalent to those which would result if the counters were directly connected to the test pins. This indirect method of generating counter-like signals at the test pins adds a new degree of flexibility in the association of particular test pins to the various bits of these "indirect counters".

DESCRIPTION OF THE FIGURES

FIG. 3 shows the stimulus/response data types stored in Local Test Data RAMs for selecting between the raw data and derivative data modes as well as between the stimulus and response modes of pin driver circuit operation.

FIGS. 4A–4D illustrate for the case of a four bit wide counter sequence a set of derivative data vectors stored in the local test data RAMs suitable for applying counter sequences on two different sets of pins.

DESCRIPTION OF THE PREFERRED EMBODIMENT

Figure 1:
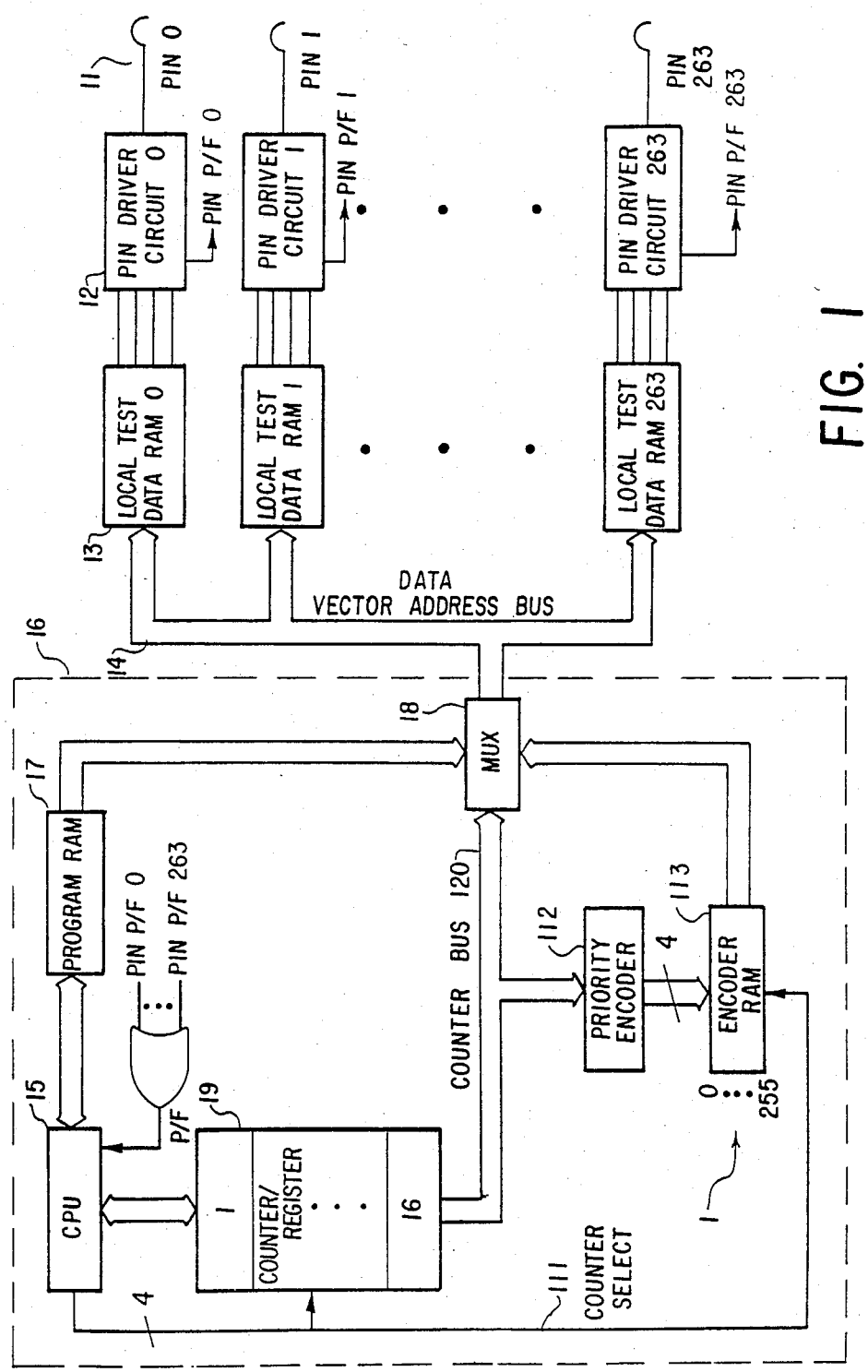
FIG. 1 shows a block diagram of an apparatus suitable for implementing the disclosed circuit test technique.

In this section, the first digit of each reference numeral will represent the first figure in which the element indicated by that reference numeral appears. In FIG. 1 is shown a block diagram of a circuit tester suitable for implementing a circuit test technique utilizing data compression to reduce data storage requirements and more particularly to reduce the amount of data to be downloaded to local test data RAMs required to implement a given circuit test. A set of up to 264 test pins 11 are utilized at any given time to make contact with and apply signals to a set of up to 264 connectors which connect the test pins to selected nodes of a circuit under test (denoted hereinafter as the DUT—i.e., the device under test). A 4:1 multiplexor at each pin enables each pin to be connected at any given time to one of four nodes in the DUT, so that up to 1056 different nodes in a DUT can be accessed in groups of up to 264 nodes. This system can be used for traditional functional testing as well as for in-circuit testing. In the case of in-circuit testing, the nodes are located throughout the circuit and connection from the test pins to these nodes is made, for example, by a bed of nails fixture.

Figure 2:
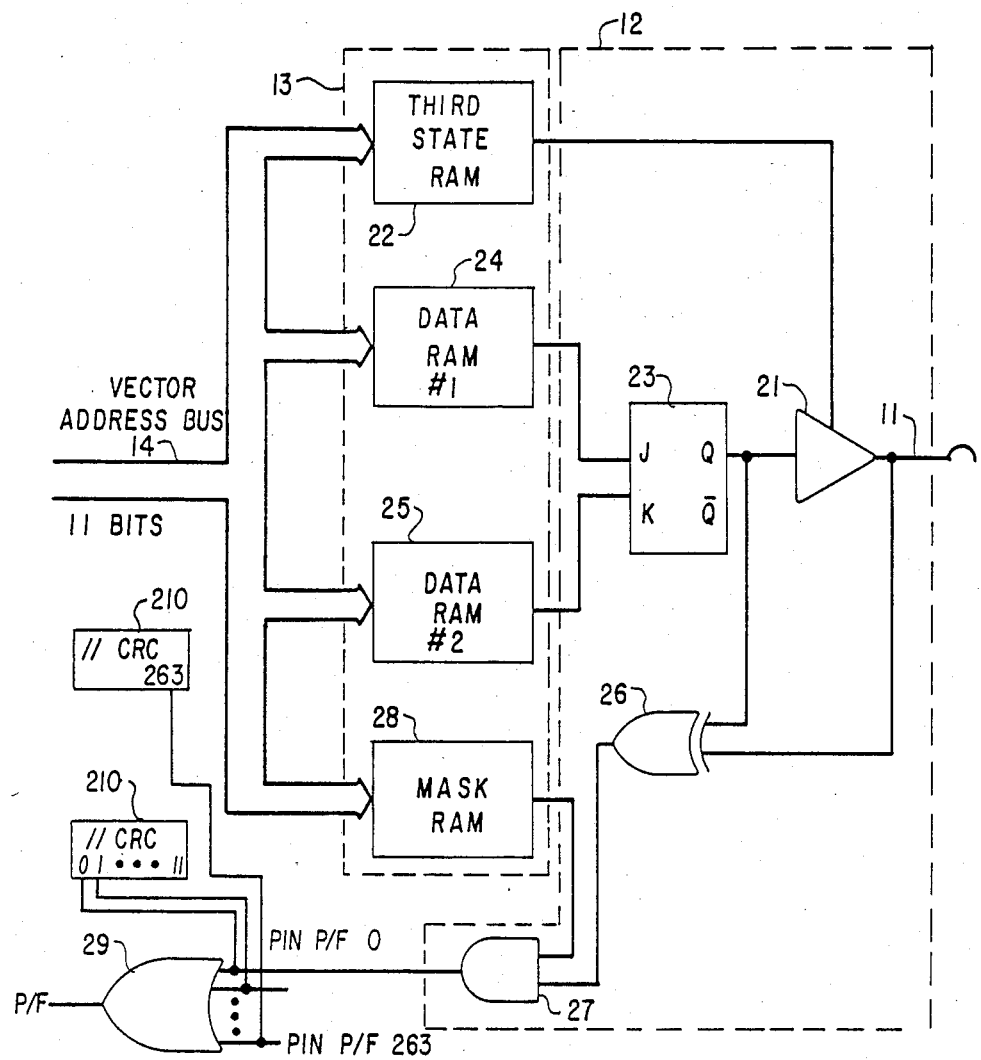
FIG. 2 is a block diagram of the pin driver circuit utilized in the apparatus shown in FIG. 1.

Each of test pins 11 is bi-directional in that each can be used to apply test signals to the circuit or to monitor signals at selected nodes of the circuit. Each test pin 11 is connected to an associated pin driver circuit 12 which controls whether that pin is driving a signal onto the node to which it is connected. Pin driver circuit 12 also monitors the signal present on the test pin to enable signals on selected nodes of the DUT to be monitored. A block diagram of the pin driver circuit is shown is FIG. 2.

Each pin 11 is connected to a driver 21 in its associated pin driver circuit 12. Driver 21 is enabled or disabled in response to a drive enable signal from a third state RAM 22. The input of driver 21 is connected to the Q output of a J-K flip-flop 23 which provides either the stimulus to be applied to pin 11 or the response expected on pin 11. The stimulus/response (S/R) provided by J-K flip-flop 23 is controlled in response to the outputs of a first Data RAM 24 connected to the J input of the flip-flop and a second Data RAM 25 connected to the K input of the flip-flop. The input and the output of driver 21 are each connected to an input of an exclusive-OR gate 26 to enable signal son the pin to be monitored and compared with expected response data on-the-fly. The output of exclusive-OR gate 26 is connected to an input of an AND gate 127 to enable this information to be masked from a central processing unit (CPU) 15 (shown in FIG. 1) when that information is not of interest to the test procedure. The masking of this data is controlled by a mask signal from the output of a Mask RAM 28 which is connected to another input of AND gate 27. AND gate 27 produces a pin pass/fail (P/F) signal which is supplied to an input of an OR gate 29. Each pin driver circuit 12 applies its pin pass/fail signal to a different input of OR gate 29 to produce a pass/fail signal which is supplied to CPU 15 to indicate whether the DUT has passed or failed the test pattern that was applied at test pins 11. The output of AND gate 27 of each pin driver circuit 12 is also connected along with the pin pass/fail outputs of eleven other pin driver circuits 12 to one of a set of twenty-two parallel CRC compressors 210 which produce a set of up to twenty-two signatures characterizing a test.

The combination of RAMs 22, 24, 25 and 28 is referred to herein as local test data RAM 13. RAM 13 cooperates with pin driver circuit 12 to determine in which of two modes signal/response data is utilized. These two modes are referred to as the raw data mode and the derivative data mode. In the raw data mode, either a 0 or a 1 is supplied to J-K flip-flop 23. In response to a 0, the J-K flip-flop output is low and in response to a 1, the J-K flip-flop output is high. In the derivative data mode, either a "keep" (denoted by a K) or a "toggle" (denoted by a T) piece of data is provided to J-K flip-flop 23. In response to a keep, the state of J-K flip-flop is unchanged and in response to a toggle, the state of the J-K flip-flop is changed to its complementary state. The data from RAMs 24 and 25 determine whether a 0, 1, K or T data is provided by pin driver circuit 12.

The driver enable signal from RAM 22 controls whether pin driver circuit 12 functions in stimulus mode in which the driver is enabled to apply a signal to pin 11 or whether pin driver circuit 12 functions in response mode in which the driver is disabled so that the signal on pin 11 is only monitored and compared by exclusive-OR gate 26 to an expected response signal at the output of J-K flip-flop 23. Even in the stimulus mode, the comparison by exclusive-OR gate is performed so that the signal on pin 11 is checked against the value to which it is to be driven. In the response mode, the comparison of data on the fly avoids the need to read back response data into CPU 15 and compare it to expected responses, thereby increasing throughput.

The pass/fail signal can also be utilized in real time to control the testing of the DUT and therefore CPU 15 is responsive to the pass/fail signal. For example, as is discussed in greater detail below, test sequence information can be stored in the form of a test program which includes nested loops and conditional branches. The pass/fail signal can be utilized by such programs at conditional branch points. This enables the use of a simple homing routine in which the response data represents the home state of a circuit component being homed and that component is incremented through a sequence of states until the pass/fail signal indicates that the states of the nodes being monitored equal the response states in the pin driver circuits connected to those nodes. The particular sequence of states through which the component to be homed is sequenced will in general be a function of the component and user design choice, but this system eliminates the need for time consuming comparisons in the CPU of the monitored data against the response data corresponding to the home state. Thus, very simple homing algorithms can be used which just sequence a device through all of its states until the home state is detected on the fly. This enables a component to be homed at the hardware test rate rather than the much slower software test rate of the circuit tester.

The full set of states determined by the S/R data passed from local test data RAM 13 to pin driver circuit 12 is presented in FIG. 3. These states include: the stimulus states 0, 1, K and T; the response states 0, 1, K and T; and a don't care state X in which neither stimulus data is applied to the pin nor pass/fail information is generated. The particular one of these states selected is determined in response to a data vector address applied to local test data RAM 13 over a data vector address bus 14. All of the local test data RAMs have the same address range and all of the local test data RAMs are accessed concurrently by a single data vector address on bus 14. The ordered set of all test data at the same address in each of the local test data RAMs is referred to herein as a data vector. The set of signal states on the pins corresponding to a given data vector is referred to herein as a vector. For the 264 local test data RAMs utilized in this embodiment, this results in vectors that are 264 bits wide and data vectors that are 1056 bits wide.

In a simple mode of operation, data vectors can be stored in RAMs 13 in the order that the data vectors are to be used so that a test can be performed by accessing RAMs 13 in sequential order. Even though the total number of possible unique vectors is much larger than the number of data vectors utilized in any given test, it turns out that, in a typical test, many of the data vectors are repeated and that the total number of unique data vectors is on the order of several hundred or less. By eliminating redundant data vectors, the amount of test information to be stored is greatly reduced so that during a test the amount of data downloaded to the local test data RAMs is also greatly reduced. Because the sequence in which the data vectors stored in local test data RAMs is no longer determined by the order in which they are stored in these RAMs, some overhead is required to sequence these data vectors—that is, as shown in FIG. 1, a sequencer 16 is required to control the sequence in which the unique data vectors are accessed in local test data RAMs 13. The most simplistic way of storing this data is to store in a sequencer memory an ordered list of the data vector addresses in the order in which these addresses are to be accessed. Even in this technique, there will generally be a reduction in memory required as compared to the case in which redundant data vectors are not eliminated because the length of a typical data vector address is much less than the length of the data vectors. For the case in which RAMs 22, 24, 25 and 28 are 2K RAMs, the data vector address need only be 11 bits long, which is much less than the 1056 bits in a data vector.

Part of the reason that there are so few unique data vectors is that in a typical test the number of test pins 11 utilized is closer to 20 than to the 264 that are available for testing a small class of DUTs. Part of the reason that redundant data vectors appear is that the circuits being tested are not random. For example, a RAM is often tested by accessing its memory locations in the same order as the numerical addresses of its memory locations. In addition, a user who designs a test used to test a circuit typically approaches the tests in an orderly manner that can be represented by a test algorithm. Thus, a vector sequence in a given test can usually be represented very compactly by a test program. Sequencer 16 contains sufficient logic that it can execute test programs that include a broad class of software tools including nested loops, subroutines, conditional branches, unconditional branches and parameterized vectors. The logic is also capable of implementing "indirect counters" at the test pins as discussed in greater detail below.

To implement test programs, sequencer 16 includes a CPU 15 and a program RAM 17 which are connected by a multiplexer 18 to data vector address bus 14. The test program, stored in the program RAM is executed by the CPU to supply data vector addresses over data vector address bus 14 to the local test data RAMs. Sequencer 16 also contains a set of sixteen counter/registers 19 which are used to keep track of nested loops, to pass data vector parameters, and to produce at pins selected by the user counter-like data (i.e., "indirect counters") such as a numerical sequence of test signals and Gray code data. Preferably, these counter/registers have at least as many bits as the data vector addresses so that they can be used to pass directly to data vector address bus 14 any address within the address range of local test data RAMs 13, thereby implementing parameterized vectors. Counter/registers 19 are connected by a counter/register bus 110 to multiplexor 18 to enable direct passage of data vector addresses to bus 14. A counter select line 111 connects CPU 15 to counter/register 19 to enable the CPU to control access to and from each of these counters.

A priority encoder 12 and an encoder RAM 113 are connected between counter/registers 19 and multiplexer 18 to implement the indirect counters—i.e., to enable the counters to produce counter-like (e.g., sequential and Gray code) test data at a selected set of pins. The role of counter/registers 19, priority encoder 112 and encoder RAM 113 in producing such data can be understood by reference to FIGS. 4A–4D. These figures illustrate the case in which only the four least significant bits of the counter are utilized, but more general cases are easily understood from that example.

In FIG. 4A are listed in numerical order the sixteen different binary states that a 4-bit counter can assume. To the right of this list is the derivative mode data required to increment the counter through this ordered list to implement a binary up-counter. For example, the derivative mode vector KKKT applied to the indirect counter state 0000 converts the state to 0001. The derivative mode vectors are arranged in several columns to highlight the pattern with which those vectors recur. It should first be noted that there are only four derivative mode vectors required to sequence through in numerical order to sixteen states of this counter. These vectors are listed in FIG. 4B. In general, an N-bit counter requires only N unique derivative mode vectors.

It should next be noted that these derivative mode vectors have a simple pattern, namely, that they are the set of vectors in which there is at least one toggle and in which no toggle is located in a more significant bit location than a keep. Finally, it should be noted that the pattern of occurrence of the derivative vectors to produce this sequential series of states is closely related to the counter state being toggled—namely, when the least significant zero of the counter state occurs in counter bit n, the most significant bit of the derivative vector required to toggle the counter state to its next value has its most significant toggle bit in bit n.

It turns out that a priority encoder utilized in ordering interrupts in computers locates the binary location n of the least significant zero in a binary word. For that reason, priority encoder 112 is utilized in conjunction with counter/registers 19 and encoder Ram 113 to implement indirect counters on selected sets of pins. Encoder RAM 113 is divided into sixteen contiguous sets of sixteen locations and each set is associated with a unique one of the sixteen counter/registers 19. Counter select 111 determines which of these counters and which of these sets of encoder RAM locations is accessed in any given access. This is achieved by utilizing the 4 bits of the counter select signal as the four most significant bits of the encoder RAM location to be accessed. Priority encoder 112 determines the four least significant bits of the encoder RAM location to be accessed. The sixteen counters 19 can be utilized to implement up to sixteen indirect counters on pins 11.

In FIG. 4C are listed nine vectors suitable for implementing a pair of 4-bit counters on pins 0–5. The vector in local test data RAM location 100 is utilized to reset either of these indirect counters to the zero state. To implement a 4-bit up-counter on pins 0–3, local test RAM addresses 101–104 are entered into consecutive locations in one of the sets of sixteen locations of encoder RAM 113 and the counter 19 associated with this set of locations is utilized to keep track of which of the sixteen 4-bit indirect counter states is being applied on pins 11. For the sake of illustration, it is assumed here that the first of counter/registers 19 is utilized and that the addresses 101–104 are entered in order into locations 0–3, respectively, of encoder RAM 113. Therefore, the value of counter select 111 is 0000 for this case.

As the CPU increments the first counter/register through its sixteen 4-bit states, at each increment, the contents of that counter are passed over counter/register 120 to priority encoder 112. In response to the first counter/register's values, encoder encoder 112 accesses the nth location of encoder RAM each time it detects the least significant zero of the first counter being in the nth least significant bit of that counter. This results in the data derivative vectors shown in FIG. 4A being uitilized on pins 0–3 in the order shown in FIG. 4A. A down counter is implemented as an indirect counter on pins 0–3 in an analogous manner using FIG. 4A. In a similar manner, the secnd of counter/registers 19 can be utilized in association with the vectors stored in local test RAM locations 200, 209, 118, and 6 to implement an up-counter indirect counter on pins 4, 1, 3 and 5 by storing these four locations in order in locations 16-19 in encoder RAM 113. This example illustrates that any pin can be associated with any selected bit of a given indirect counter. Similarly, it illustrates that the derivative vectors utilized for a given indirect counter need not be stored in sequential order in the local test RAMs.

Figure 4D:
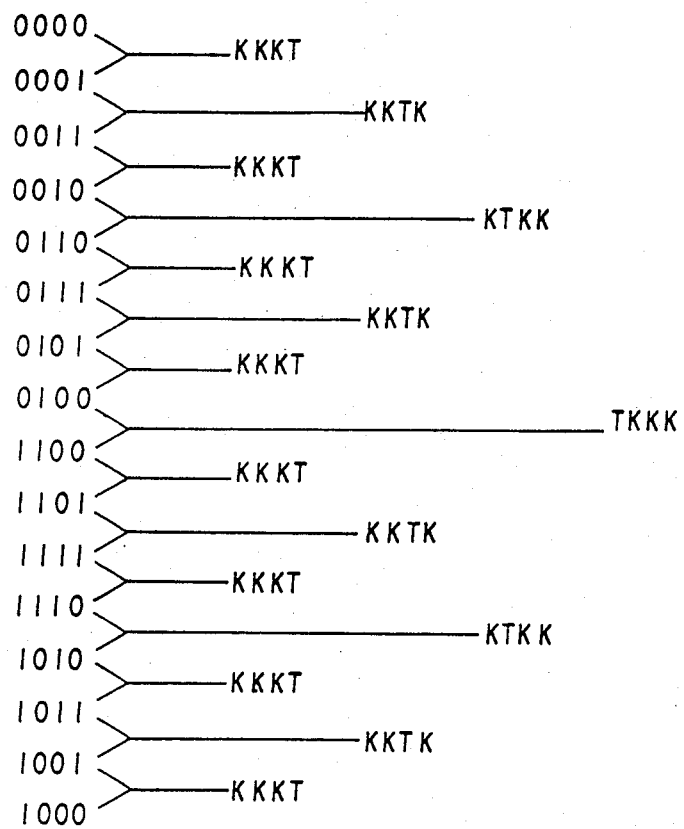

In the up-counter example just discussed, the four least significant bits of the first counter/register 19 are reproduced on pins 0-3, but in the down-counter example, this is not true—i.e., the value of the indirect counter implemented on pins 0-3 need not mirror the contents of counter/registers 19. This felxibility enables Gray code indirect counters to be as easily implemented as up- and down-counters. That this is so is shown in FIG. 4D which shows the unique set of derivative vectors and the sequence in which they must be utilized to implement the Gray code illustrated there. To implement that Gray code, the derivative vectors KKKT, KKTK, KTKK and TKKK are entered into consecutive locations of one of the sets of locations in encoder RAM 113. Other Gray codes are similarly implemented.

The blank entries in the table in FIG. 4C indicate that those data bits can assume any value without adversely affecting the implementation of the indirect counters. In some circumstances, it may not be desired to increment a given indirect counter on succesive tester clock cycles. Thus, the program in program RAM 17 can insert between successive accesses to encoder RAM 113 vector addresses that do not affect the counter state of a given indirect counter. Similarly, as long as the pin sets for two different indirect counters are disjoint, the steps of incrementing each of these indirect counters can be interleaved. Also, as long as these pin sets are disjoint, these two counters can be incremented synchronously by utilizing a set of derivative vectors that increment both indirect counters concurrently.

It should be noted that if the indirect counters were implemented by raw data vectors instead of derivative data vectors, that an N-bit counter would required $2^N$ unique vectors. Thus, selection of derivative mode data for the counters results in a significant compression of the amount of data required in local test RAMs 12. The selection between raw and derivative mode is determined on a pin-by-pin and vector-by-vector basis by the data stored in each local test RAM 12 so that similar compression is achievable for other algorithmic sequences of tests by checking whether derivative or raw data mode results in fewer unique vectors.

We claim:

1. A circuit tester comprising:
a plurality of test pins; and
driver means, responsive to derivative data vectors, for driving test vectors on the test pins.

2. A circuit tester as in claim 1 wherein said driver means is also responsive to raw data vectors to produce test vectors on the test pins.

3. A circuit tester as in claim 2 wherein said driver means includes means for selecting between derivative data and raw data on a pin-by-pin basis.

4. A circuit tester as in claim 2 further comprising:
local test data memory connected to the driver means for storing data vectors, said driver means being responsive to data vectors stored in said local test data memory to produce test vectors on the test pins.

5. A circuit tester comprising:
a plurality of test pins;
driver means for applying test signals to the test pins;
local test data memory connected to the driver means for storing data vectors, said driver means being responsive to data vectors stored in said local test data memory;
said driver means being responsive to derivative mode data vectors for applying test signals to the test pins; and
a sequencer which controls the sequence in which the driver means is responsive to data vectors stored in the local test data memory, whereby each data vector is executed by the driver means in the sequence determined by the sequencer.

6. A circuit tester as in claim 5 wherein the driver means further includes means for applying raw data.

7. An improved method of testing circuits of the type in which a set of test vectors are applied to a set of test pins connected to first set of selected nodes of a device under test and resulting signals on a second set of selected nodes are monitored to test the operation of the device under test, said improvement comprising the steps of:
applying the test vectors in response to a sequence of data test vectors stored in a local test data memory; and
utilizing both derivative data and raw data in the application of the test vectors.

8. A method as in claim 7 further comprising before the step of applying the test vectors, the steps of:
analyzing the data vectors utilized in a given test to determine whether the number of data vectors required for the test can be reduced by selective use of derivative data and raw data; and
using a combination of derivative and raw data that reduces the number of data required for a given test compared the number required if only raw data are utilized.

9. A circuit tester as in claim 3 wherein said driver means includes means for selecting between derivative data and raw data on a vector-by-vector basis.

10. A circuit tester as in claim 9 wherein the driver means comprises:
a plurality of drivers, each connected one-to-one to a test pin; and
a plurality of J-K flip-flops, each connected one-to-one to the input of a driver;
said data vectors each containing a plurality of digits; and each of said flip-flops being responsive to and associated one-to-one with a digit in the data vectors, wherein each digit consists of a pair of bits one of which is applied to the J input of the J-K flip-flop and the other of which is applied to the K input of the J-K flip-flop.

11. A method of testing circuits comprising the steps of:
storing in a memory a set of unique data vectors;
applying said unique data vectors to a set of associated drivers, each of which is responsive to data in both derivative mode and raw data mode to apply vectors to a set of test pins; and
in the step of storing data vectors, selecting between derivative mode and raw data mode on a vector by vector basis to reduce the number of unique vectors required for a given test.

12. A method of testing circuits comprising the steps of:
storing in a memory a set of unique data vectors;

applying said unique data vectors to a set of associated drivers, each of which is responsive to data in both derivative mode and raw data mode to apply vectors to a set of test pins; and in the step or storing data vectors, selecting between derivative mode and raw data mode on a pin by pin basis to reduce the number of unique vectors required for a given test.

13. A method of testing circuits as in claim 12 wherein, in the step of storing unique data vectors, further selecting between derivative mode and raw data mode on a vector by vector basis to reduce the number of unique vectors required for a given test.

* * * * *